United States Patent
Lee et al.

(10) Patent No.: US 10,391,604 B2
(45) Date of Patent: Aug. 27, 2019

(54) METHOD OF PROCESSING THIN LAYER

(71) Applicant: SK hynix Inc., Icheon (KR)

(72) Inventors: Young Ju Lee, Seoul (KR); In Hoe Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 61 days.

(21) Appl. No.: 15/462,561

(22) Filed: Mar. 17, 2017

(65) Prior Publication Data

US 2018/0036859 A1 Feb. 8, 2018

(30) Foreign Application Priority Data

Aug. 8, 2016 (KR) .................. 10-2016-0100492

(51) Int. Cl.
| | |
|---|---|
| *B24B 37/20* | (2012.01) |
| *B24B 37/34* | (2012.01) |
| *H01L 21/67* | (2006.01) |
| *H01L 21/321* | (2006.01) |
| *H01L 21/02* | (2006.01) |
| *B24B 37/10* | (2012.01) |
| *B24B 53/017* | (2012.01) |

(52) U.S. Cl.
CPC ............ *B24B 37/20* (2013.01); *B24B 37/107* (2013.01); *B24B 37/34* (2013.01); *B24B 53/017* (2013.01); *H01L 21/02074* (2013.01); *H01L 21/3212* (2013.01); *H01L 21/67092* (2013.01)

(58) Field of Classification Search
CPC ........... H01L 21/02074; H01L 21/3212; H01L 21/67092; B24B 37/20; B24B 37/34
See application file for complete search history.

(56) References Cited

U.S. PATENT DOCUMENTS

| | | | | |
|---|---|---|---|---|
| 6,200,899 B1* | 3/2001 | Fournier | ............ | H01L 21/02074 257/E21.304 |
| 6,849,541 B1* | 2/2005 | Hu | ............ | H01L 21/76811 257/E21.579 |
| 8,455,362 B2* | 6/2013 | Zhao | ............ | H01L 21/02074 216/89 |
| 2002/0090820 A1* | 7/2002 | Sun | ............ | C09G 1/02 438/690 |
| 2003/0211814 A1* | 11/2003 | Shih | ............ | B24B 37/042 451/36 |
| 2005/0186891 A1* | 8/2005 | Benner | ............ | B24B 53/017 451/56 |
| 2006/0219663 A1* | 10/2006 | Wang | ............ | C09G 1/02 216/88 |
| 2007/0082485 A1* | 4/2007 | Chiang | ............ | B82Y 30/00 438/665 |
| 2007/0232069 A1* | 10/2007 | Tseng | ............ | H01L 21/02074 438/692 |
| 2009/0057264 A1* | 3/2009 | Mai | ............ | B24B 37/042 216/13 |

(Continued)

FOREIGN PATENT DOCUMENTS

KR 10-0849070 B1 7/2008

*Primary Examiner* — Marc Carlson (57) ABSTRACT

In a method of processing a thin layer according to an embodiment, a substrate having a processing target layer is provided into a polishing module of a thin layer processing apparatus. A chemical mechanical polishing process using a polishing slurry is performed on the processing target layer. The substrate is cleaned using a cleaning slurry.

18 Claims, 6 Drawing Sheets

(56) References Cited

U.S. PATENT DOCUMENTS

| | | | |
|---|---|---|---|
| 2009/0130849 A1* | 5/2009 | Lee | B24B 37/044 |
| | | | 438/693 |
| 2009/0133722 A1* | 5/2009 | Koh | B08B 1/04 |
| | | | 134/63 |
| 2010/0075501 A1* | 3/2010 | Abe | C09K 3/1463 |
| | | | 438/693 |
| 2010/0255681 A1* | 10/2010 | Chang | C09G 1/02 |
| | | | 438/692 |
| 2012/0001262 A1* | 1/2012 | Kang | H01L 21/02074 |
| | | | 257/368 |
| 2015/0179432 A1* | 6/2015 | Suen | B24B 37/20 |
| | | | 257/288 |
| 2015/0290765 A1* | 10/2015 | Otsuka | B24B 53/007 |
| | | | 451/56 |
| 2018/0036859 A1* | 2/2018 | Lee | B24B 37/20 |

* cited by examiner

FIG. 6

METHOD OF PROCESSING THIN LAYER

CROSS-REFERENCE TO RELATED APPLICATION

The present application claims priority under 35 U.S.C 119(a) to Korean Application No. 10-2016-0100492, filed on Aug. 8, 2016, which is herein incorporated by reference in its entirety.

BACKGROUND

1. Technical Field

Various embodiments of the present disclosure generally relate to a method of processing a thin layer, and more particularly, to a cleaning method which can effectively remove by-products remaining on a substrate after performing a chemical mechanical polishing with respect to a processing target layer on the substrate.

2. Related Art

Various processing methods have been applied as methods of fabricating an integrated circuit on a substrate. Chemical mechanical polishing has been applied to achieve etching and planarization for a thin layer stacked on a substrate at the same time or to form a thin layer pattern for a patterning target thin layer without performing a photolithography process.

In general, chemical mechanical polishing may be performed by providing a polishing slurry containing chemical mechanical polishing particles onto a polishing pad, and polishing a surface of the processing target layer on the substrate using the polishing pad, thereby removing the processing target layer.

SUMMARY

A method of processing a thin layer according to an aspect of the present disclosure is disclosed. In the method of processing a thin layer, a substrate having a processing target layer is provided into a polishing module of a thin layer processing apparatus. A chemical mechanical polishing process using a polishing slurry is performed on the processing target layer. The substrate is cleaned using a cleaning slurry.

A method of processing a thin layer according to another aspect of the present disclosure is disclosed. In the method of processing a thin layer, chemical mechanical polishing is performed to a processing target layer on a substrate using a polishing slurry. The substrate is cleaned in-situ using the polishing slurry. The processing target layer includes at least one selected from the group consisting of copper (Cu), aluminum (Al), ruthenium (Ru), titanium nitride (TiN), tungsten nitride (WN), tantalum nitride (TaN), and ruthenium oxide ($RuO_2$). The polishing slurry includes a metal oxide powder as an abrasive, and hydrogen peroxide ($H_2O_2$) as an oxidizing agent.

BRIEF DESCRIPTION OF THE DRAWINGS

Various embodiments of this disclosure will become more apparent in view of the attached drawings and accompanying detailed description, in which.

DETAILED DESCRIPTION OF THE EMBODIMENTS

Various embodiments will now be described hereinafter with reference to the accompanying drawings. In the drawings, the dimensions of layers and regions may be exaggerated for clarity of illustration. The drawings are described from the observer's point of view. If an element is referred as being located on another element, it may be understood that the element may be directly located on the other element, or an additional element may be interposed between the element and the other element. The same reference numerals refer to the same elements throughout the specification.

In addition, expression of the singular form should be understood to include the plural forms unless clearly used otherwise in the context. It will be understood that the terms "comprise" or "have" are intended to specify the presence of a feature, a number, a step, an operation, an element, a part or combinations thereof, but not used to preclude the presence or possibility of addition one or more other features, numbers, steps, operations, components, parts or combinations thereof.

Further, in performing a method, each process constituting the method can take place differently from the order in which it is presented unless a specific sequence is described explicitly by the text of this disclosure. In other words, each process may be performed in the same stated order, processes may be performed substantially at the same time, or processes may be performed in another order.

The present disclosure provides an embodiment of a cleaning method which can effectively remove by-products remaining on a substrate after performing chemical mechanical polishing on a processing target layer of the substrate.

In a method of processing a thin layer according to an embodiment, a chemical mechanical polishing process is performed on processing target layer, and then a cleaning process is performed on the polished processing target layer using a cleaning slurry. Through the cleaning process, the by-products remaining on the substrate after the chemical mechanical polishing process can be effectively removed. The method of processing a thin layer may be performed, for example, using a thin layer processing apparatus as illustrated in FIG. 1.

Figure 1:
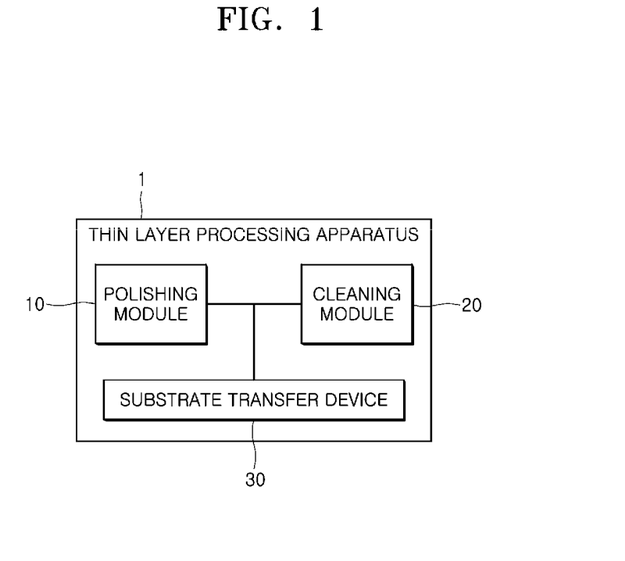
FIG. 1 is a block diagram illustrating a thin layer processing apparatus according to an embodiment.

FIG. 1 is a block diagram illustrating a thin layer processing apparatus according to an embodiment.

Referring to FIG. 1, the thin layer processing apparatus 1 includes a polishing module 10, a cleaning module 20, and a substrate transfer device 30. The polishing module 10 and the cleaning module 20 are physically separated from each other. The substrate transfer device 30 transfers the substrate having a processing target layer between the polishing module 10 and the cleaning module 20.

The polishing module 10 is a part of the thin layer processing apparatus 1 in which the chemical mechanical polishing of the processing target layer on the substrate is performed. As will be described later, in the polishing module 10, after a polishing pad to which a polishing slurry is provided contacts the processing target layer, the processing target layer may be polished by a frictional force applied between the polishing pad and the processing target layer. The polishing pad may have a surface with a controlled surface roughness suitable for polishing. Chemical mechanical polishing of the processing target layer on a substrate may be performed by the polishing module 10.

In addition, a cleaning process may be performed on the substrate to which the chemical mechanical polishing has been applied in the polishing module 10. The cleaning process can remove the by-products which are generated during the chemical mechanical polishing process and remains on the substrate from the substrate. The by-products may, for example, have a form of a particle or a form of a fragment of a thin layer.

The substrate to which the cleaning process using the cleaning slurry has been applied may be removed from the polishing module 10 and transferred to the cleaning module 20 by the substrate transfer device 30. The cleaning module 20 is a part of the thin layer processing apparatus 1, which performs an additional cleaning process on the substrate transferred from the polishing module 10 using a wet cleaning method. In the wet cleaning, a cleaning solution containing ammonium hydroxide (NH4OH) or hydrogen fluoride (HF) may be applied.

In an embodiment, in the wet cleaning, the cleaning solution may be sprayed on a surface of the substrate, and the by-products on the substrate and the cleaning solution react with each other. In the wet cleaning, the by-products on the substrate can be additionally removed.

The substrate transfer device 30 may transfer the substrate from outside into the thin layer processing apparatus 1, or transfer the substrate between the polishing module 10 and the cleaning module 20 inside the thin layer processing apparatus 1. The substrate transfer device 30 may include a substrate support in contact with the substrate, and a robot arm connected to the substrate support that transfers the substrate to a predetermined position. In other words, the substrate transfer device 30 may include the physical equipment that is used to transfer the substrate between various modules, or stages, of the thin layer processing apparatus 1, as well as loading and unloading substrates into and out of the thin layer processing apparatus 1.

Though it is not illustrated, the thin layer processing apparatus 1 may further include a controller monitoring the operations of the polishing module 10, the cleaning module 20, and the substrate transfer device 30, and controlling the operations of the polishing module 10, the cleaning module 20, and the substrate transfer device 30 based on a result of monitoring.

Figure 2:
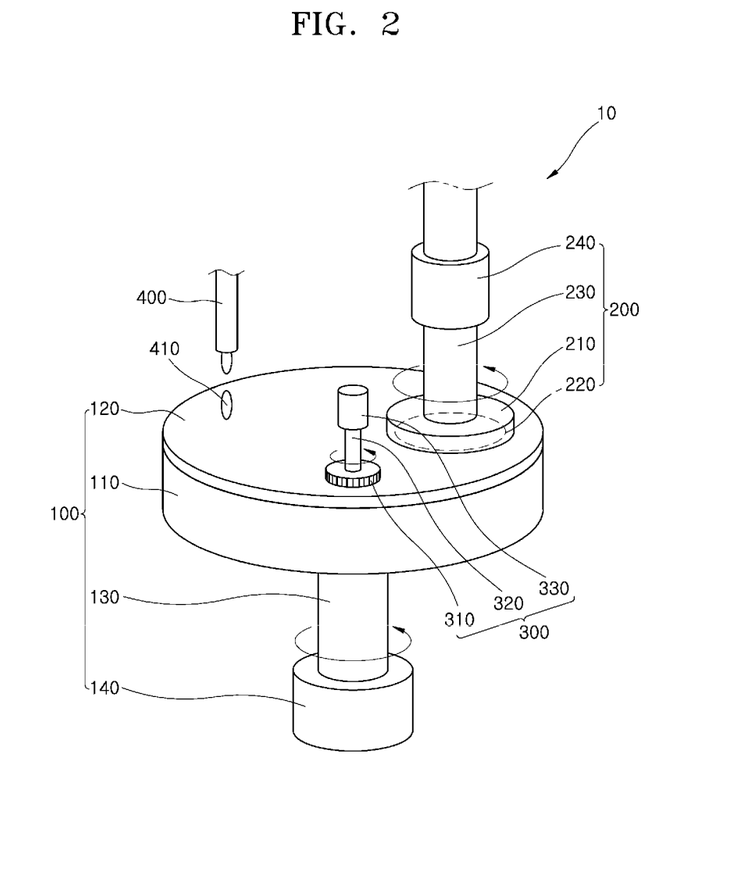
FIG. 2 is a view illustrating a polishing module of a thin layer processing apparatus according to an embodiment.

FIG. 2 is a view illustrating a polishing module of a thin layer processing apparatus according to an embodiment.

Referring to FIG. 2, the polishing module 10 may include a pad assembly 100, a substrate carrier 200, a conditioner 300, and a slurry dispenser 400.

The pad assembly 100 may include a worktable 110, and a polishing pad 120 disposed on the worktable 110. The pad assembly 100 may include a worktable driver 140 connected to the worktable 110 by a drive shaft 130.

The polishing pad 120 is disposed on the worktable 110. The polishing pad 120 may include a concave-convex pattern having a concave, or recessed portion and a convex, or protruding portion on a surface to allow the polishing of the processing target layer to be easily performed. The polishing pad 120 may be joined to and rotate with the worktable 110, as the drive shaft 130 is rotated by the worktable driver 140.

The polishing pad 120 may receive a slurry 410 from the slurry dispenser 400. The slurry 410 may be a polishing slurry applied to a chemical mechanical polishing process or a cleaning slurry applied to a cleaning process.

The polishing pad 120 may be in contact with the processing target layer on the substrate 220 supported by the substrate carrier 200. In a state in which the slurry 410 is provided to the polishing pad 120, each of the polishing pad 120 and processing target layer rotates, respectively, while being in contact with each other, and therefore, the processing target layer can be polished by a frictional force.

The substrate carrier 200 may include a head 210 that fixes the substrate 220 to the carrier 200, and a substrate driver 240 connected to the carrier head 210 by a drive shaft 230. The substrate 220 may contact the polishing pad 120 by the substrate driver 240. At this time, the substrate driver 240 may apply a predetermined force to the substrate 220 and the polishing pad 120. Subsequently, as the substrate driver 240 rotates the drive shaft 230, the substrate 220 may be rotated while being in contact with the head 210.

The substrate carrier 200 may drive the substrate 220 to rotate against the polishing pad 120 through the drive shaft 230, and drive the substrate 220 to slide on the polishing pad 120. In other words, the carrier 200 may rotate the substrate 220 while drawing it across the surface of the polishing pad in a reciprocating motion. Accordingly, the processing target layer on the substrate 220 may be polished while being moved across the surface of of the polishing pad 120.

The conditioner 300 may include a conditioning disk 310, a drive shaft 320, and a conditioning disk driver 330. The conditioning disk 310 may restore the polishing ability of the polishing pad 120 when its polishing ability is degraded by decreased surface roughness due to a result of the polishing operation with the substrate 220.

The conditioning disk driver 330 may bring the conditioning disk 310 into contact with the polishing pad 120. At this time, the conditioning disk driver 330 may apply a predetermined force to the conditioning disk 310 and the polishing pad 120. The conditioning disk driver 330 may rotate the drive shaft 320 when the conditioning disk 310 and polishing pad 120 are in contact with each other so that the conditioning disk 310 rubs and scratches a surface of the polishing pad 120. Due to the rubbing, the surface roughness of the polishing pad 120 can be improved, and therefore, the polishing ability of the polishing pad 120 can be restored.

The conditioning disk driver 330 may drive the conditioning disk 310 to rotate through the rotation drive 320 and drive the conditioning disk 310 to slide on the surface of the polishing pad 120 at the same time. Therefore, the whole surface of the polishing pad 120 can be conditioned.

In an embodiment, the conditioning process by the conditioner 300 may be performed at the same time as the chemical mechanical polishing process which is performed between the polishing pad 120 and the substrate 220. Referring to FIG. 2, a chemical mechanical polishing for the processing target layer on the substrate 220 may be performed at a portion of the polishing pad 120, and a conditioning process by the conditioner 300 may be performed at another portion of the polishing pad 120.

The slurry dispenser 400 may provide the slurry to the polishing pad 120. In an embodiment, a nozzle for dispensing slurry onto the polishing pad 120 may present at an end of the slurry dispenser 400. The slurry dispenser 400 may spray the slurry on the polishing pad 120 at a predetermined pressure. In an embodiment, the slurry may be a polishing slurry or a cleaning slurry. The polishing slurry may be applied when performing the chemical mechanical polishing process to remove the processing target layer on the substrate. The cleaning slurry may be applied when performing a cleaning process to remove by-products remaining on the substrate 220 after performing the chemical mechanical polishing process. In an embodiment, the polishing slurry and cleaning slurry may be made of the same material. In another embodiment, the polishing slurry and cleaning slurry may be made of different materials.

Although a single slurry dispenser 400 is illustrated in FIG. 2, embodiments are not limited thereto. The polishing module 10 may include a plurality of slurry dispensers. In this case, the polishing slurry and cleaning slurry may be provided to the polishing pad 120 through different slurry dispensers. On the other hand, the polishing slurry may be provided through a plurality of different slurry dispensers, or the cleaning slurry may be provided through a plurality of different slurry dispensers. Also, though it is not illustrated in FIG. 2, a spray nozzle for spraying a cleaning solution such as de-ionized water on the polishing pad 120 may present in the slurry dispenser 400.

As described above, with regard to the method of processing a thin layer according to an embodiment, both the chemical mechanical polishing process using the polishing slurry and the chemical mechanical polishing process using the cleaning slurry may be performed in the polishing module 10.

Figure 3:
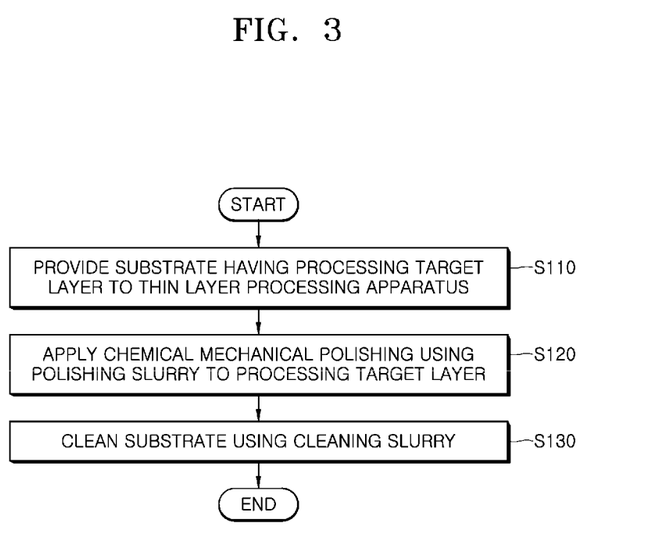
FIG. 3 is a flow chart illustrating a method of processing a thin layer according to an embodiment.

FIG. 3 is a flow chart illustrating a method of processing a thin layer according to an embodiment of the present disclosure. The method of processing a thin layer may be performed, for example, using the thin layer processing apparatus 1 described above with respect to FIGS. 1 and 2.

Referring to FIG. 3, a substrate 220 having a processing target layer may be provided to the thin layer processing apparatus 1 (S110). More specifically, the substrate 220 may be transferred into a polishing module 10 of the thin layer processing apparatus 1.

The substrate 220 may, for example, be a semiconductor substrate, a metal substrate, or an insulation substrate to which a semiconductor integration process can be applied. In an embodiment, the substrate 220 may include a material such as silicon (Si), germanium (Ge), gallium arsenic (GaAs), or the like.

The processing target layer may include an insulating layer, a conductive layer, or a stacked structure including two or more insulating or conductive layers. The conductive layer may include, for example, a metal material, a conductive metal nitride material, and a conductive metal oxide material. The conductive layer may, for example, include copper (Cu), aluminum (Al), tungsten (W), ruthenium (Ru), titanium nitride (TiN), tungsten nitride (WN), tantalum nitride (TaN), ruthenium oxide ($RuO_2$), or a combination including two or more of these materials.

A chemical mechanical polishing process using a polishing slurry may be performed on the processing target layer (S120). The polishing slurry may, for example, include a metal oxide powder as an abrasive and hydrogen peroxide ($H_2O_2$) as an oxidizing agent. The metal oxide powder may, for example, include silica ($SiO_2$), alumina ($Al_2O_3$), ceria ($CeO_2$), titania ($TiO_2$), or a combination including two or more of these materials.

In an embodiment, the chemical mechanical polishing process may be performed in the polishing module 10 of the thin layer processing apparatus 1. When the chemical mechanical polishing is performed, the polishing slurry may be provided to the polishing pad 120 through the slurry dispenser 400 at a predetermined flow rate. More specifically, the polishing slurry may be sprayed on the polishing pad 120 at a predetermined spray pressure from a spray nozzle of an end of the slurry dispenser 400. The chemical mechanical polishing process may be performed by rotating each of the polishing pad 120 accommodating the polishing slurry and the substrate 220 having the processing target layer, in a state in which the polishing pad 120 and the substrate 220 are in contact with each other.

During the chemical mechanical polishing process, a conditioning process may be simultaneously performed on a portion of the polishing pad 120 which does not contact the substrate 220. The conditioning process may be performed by the conditioner 300. The conditioning disk 310 moves across the polishing pad 120 while the conditioning disk 310 is in contact with a surface of the polishing pad 120, and therefore, the surface roughness of the polishing pad 120, which has been degraded as the chemical mechanical polishing process is performed, can be restored.

The substrate 220 may be cleaned using a cleaning slurry (S130). The cleaning slurry may, for example, include a metal oxide powder as an abrasive and hydrogen peroxide ($H_2O_2$) as an oxidizing agent. The metal oxide powder may, for example, include silica ($SiO_2$), alumina ($Al_2O_3$), ceria ($CeO_2$), titania ($TiO_2$), or a combination including two or more of these materials. In an embodiment, the cleaning slurry may include one or more same component as that of the polishing slurry. For example, the cleaning slurry may be the same as the polishing slurry. In another embodiment, the cleaning slurry may include a different material from that of the polishing slurry.

In an embodiment, the cleaning process for the substrate 220 may be performed in the polishing module 10 of the thin layer processing apparatus 1. More specifically, the cleaning process for the substrate 220 may be performed in-situ after the chemical mechanical polishing process. In other words, the cleaning process is performed on the substrate 220 in the same polishing module 10 as the polishing process.

When the cleaning process is performed, the cleaning slurry may be applied to the polishing pad 120 at a predetermined flow rate through the slurry dispenser 400. More specifically, the cleaning slurry may be sprayed on the polishing pad 120 from the spray nozzle of an end of the slurry dispenser 400 at a predetermined spray pressure. The cleaning process may be performed by rotating each of the polishing pad 120 and the substrate 220, to which the chemical mechanical polishing process has been applied, while the polishing pad 120 accommodating the cleaning slurry and the substrate 220 having the processing target layer are in contact with each other.

The cleaning process may be performed to remove the by-products that are generated by the chemical mechanical polishing process and distributed on the substrate 220. These by-products may include, for example, material removed from the substrate 220 or the polishing pad 120. When the cleaning process is performed, the polishing pad 120 may sweep a surface of the polished processing target layer on the substrate 220 so that the by-products can be separated from the substrate 220. When the polishing pad 120 sweeps the surface of the polished processing target layer on the substrate 220, the flow rate and spray pressure of the cleaning slurry provided on the polishing pad 120 may be controlled to prevent the processing target layer from being additionally removed. In other words, contact is maintained between the substrate 220 and the polishing pad 120 during the cleaning process. However, other conditions such as slurry pressure and conditioning speed are controlled to prevent a substantial amount of material from being removed from the substrate 220 during the cleaning process.

In an embodiment, the spray pressure of the cleaning slurry sprayed on the polishing pad in the cleaning process 120 may be controlled to be about $1/10$ to $1/3$ of the spray pressure of the polishing slurry sprayed on the polishing pad

120 in the chemical mechanical polishing process. For example, if the spray pressure of the polishing slurry is about 1 psi, the spray pressure of the cleaning slurry may be about ⅒ to ⅓ psi. When the spray pressure of the cleaning slurry is lower than the spray pressure of the polishing slurry, an unnecessary increase of surface roughness of the polishing pad 120 by the spraying of the cleaning slurry can be prevented such that additional removal of the processing target layer during the cleaning process can be prevented.

In an embodiment, the flow rate of the cleaning slurry sprayed on the polishing pad 120 in the cleaning process may be substantially the same as the flow rate of the polishing slurry provided on the polishing pad 120 in the chemical mechanical polishing process. Alternatively, the flow rate of the cleaning slurry sprayed on the polishing pad 120 in the cleaning process may be less than the flow rate of the polishing slurry provided on the polishing pad 120 in the chemical mechanical polishing process.

When the cleaning process is performed, the above-described conditioning process may be performed on a portion of the polishing pad 120 which does not contact the substrate 220. At this time, a conditioning speed of the cleaning process may be slower than a conditioning speed of the chemical mechanical polishing process. In an embodiment, the conditioning in the chemical mechanical polishing process may be performed at a speed of about 15 to 25 times/min over the entire surface of the polishing pad 120. By comparison, the conditioning in the cleaning process may be performed at a speed of about 1 to 3 times/min over the entire surface of the polishing pad 120. In specific embodiments, the polishing pad 120 may be conditioned less than five times per minute, or less than four, three or two times per minute.

By reducing the conditioning speed of the cleaning process, the surface roughness of the polishing pad 120 can be low compared to the chemical mechanical polishing process. As a result, embodiments of the present disclosure can prevent a removal of a significant amount of material from the processing target layer when the cleaning process is performed.

Although it is not illustrated in FIG. 3, in another embodiment, a wet cleaning may be additionally performed for the substrate 220 having the polished processing target layer. The wet cleaning may be performed using an ex-situ process in the cleaning module 20 of the thin layer processing apparatus 1. In particular, the wet cleaning is performed after the substrate transfer unit 30 moves the substrate 220 from the polishing module 10 to the cleaning module 20.

In an embodiment, after the cleaning process of operation S130 is ended, the cleaned substrate 220 may be removed from the polishing module 10 using the substrate transfer device 30. Subsequently, the removed substrate 220 may be transferred to the cleaning module 20. In the cleaning module 20, an additional cleaning process may be performed on the substrate 220 using a cleaning solution. The cleaning solution may, for example, include ammonium hydroxide ($NH_4OH$) or hydrogen fluoride (HF).

In some other embodiments, deionized water may be applied to the polishing pad 120 between operations S120 and S130. The by-products generated in the chemical mechanical polishing process may be adhered to the polishing pad 120. The adhered by-products of the polishing slurry may re-contaminate the substrate 220 when the cleaning process of operation S130 is performed. Accordingly, the surface of the polishing pad 120 may be cleaned by spraying deionized water onto the polishing pad 120 using a separately equipped spray nozzle.

As described above, according to an embodiment of this disclosure, after polishing the processing target layer using the chemical mechanical polishing process, a cleaning process is performed on the polished processing target layer using the cleaning slurry. The by-products remaining on the polished processing target layer can be effectively removed by the cleaning process. The cleaning process using the cleaning slurry may be more useful when the processing target layer is, for example, a thin metal layer. When the by-products generated by the chemical mechanical polishing process are metal or metal oxide, it may be difficult to apply a general wet cleaning process. The wet cleaning process is typically performed ex-situ. When the substrate is transferred or waits for the wet cleaning process, the by-products may be adhered to the substrate. The adhered by-products cannot be easily removed by a wet cleaning process using a cleaning solution such as ammonium hydroxide ($NH_4OH$) or hydrogen fluoride (HF).

Conventional efforts to remove the adhered by-products have been directed to applying an etching solution which can dissolve metal components of the by-products. However, because the by-products include removed particles of the processing layer material, an etching solution that removes the by-products also removes part of the substrate. It can be difficult to control an end-point of such a process so that by-products are thoroughly removed without negatively affecting the thin layer.

On the other hand, according to an embodiment of the present disclosure, a cleaning process may be performed in-situ process after the chemical mechanical polishing process is performed. In the cleaning process, damage to the polished processing target layer can be prevented by sweeping the substrate using the cleaning slurry. In addition, it is easier to control the end point of the cleaning process.

Embodiments of the present disclosure are not limited to processing a metal thin layer. Persons of skill in the art will understand that embodiments of the present disclosure can also be applied to substrates in which the processing target layer is an insulating layer, a conductive metal nitride layer, a conductive oxide layer or the like.

Figure 4:
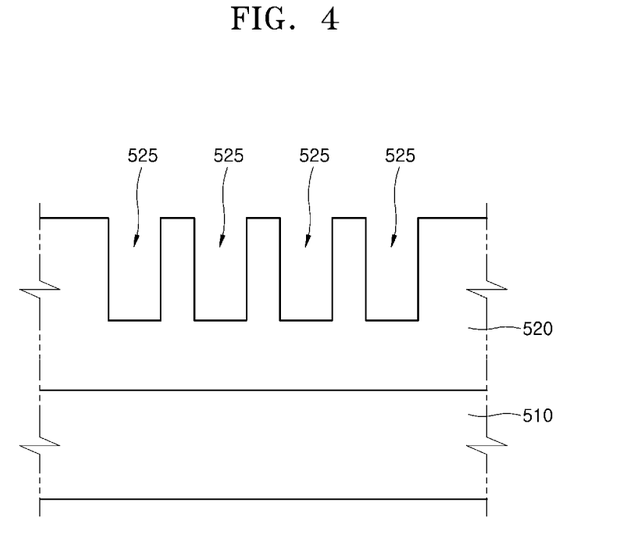
FIGS. 4 to 6 are cross-sectional views illustrating a method of processing a thin layer according to an embodiment.
Figure 5:
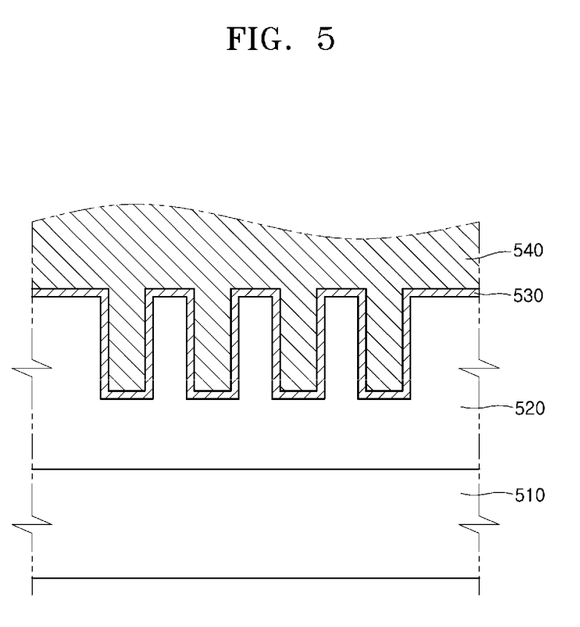
Figure 6:
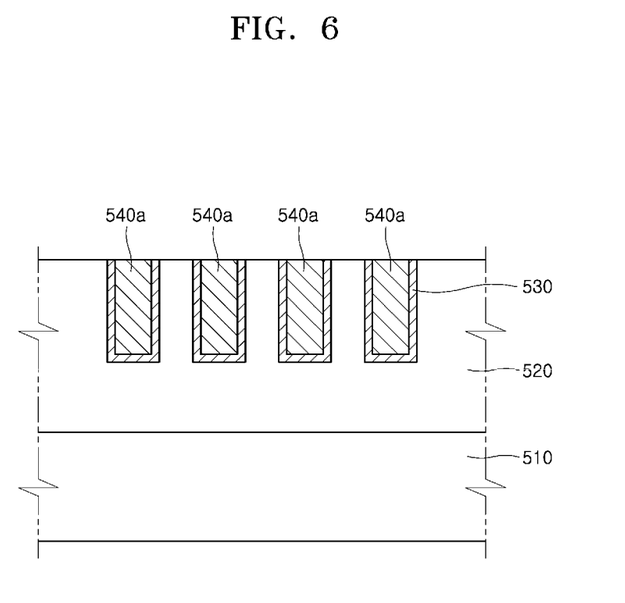

FIGS. 4 to 6 are views illustrating a method of processing a thin layer according to an embodiment.

Referring to FIG. 4, a middle layer 520 having trenches 525 may be formed on a base substrate 510. The base substrate 510 may, for example, be a semiconductor substrate such as a silicon substrate. The middle layer 520 may include an insulating layer, a conductive layer, or a combination including dielectric and conductive elements. The middle layer 520 may include at least one integrated circuit pattern layer therein.

In an embodiment, the middle layer 520 may be an interlayer dielectric layer. The interlayer dielectric layer may include, for example, a silicon oxide material. In an embodiment, the trenches 525 may be formed by selectively patterning the middle layer 520. The operation to pattern the middle layer 520 may include a photolithography process and an etching process. The etching process may include a dry etching, a wet etching, or a combination thereof.

Referring to FIG. 5, a diffusion barrier layer 530 may be formed along sidewalls of the trenches 525. The diffusion barrier layer 530 may, for example, include titanium nitride (TiN), tantalum nitride (TaN) or the like. Subsequently, a conductive layer 540 may be formed on the diffusion barrier layer 530. The conductive layer 540 may fill the trenches 525 and cover exposed surfaces of the middle layer 520 of the outside of the trenches 525. The conductive layer 540 may, for example, include copper (Cu), aluminum (Al), tungsten (W), ruthenium (Ru), titanium nitride (TiN), tungsten nitride (WN), tantalum nitride (TaN), ruthenium oxide ($RuO_2$), or a combination including two or more of these materials. In an embodiment, the conductive layer 540 may include tungsten (W). The diffusion barrier layer 530 and conductive layer 540 may be formed using, for example, chemical vapor deposition (CVD), sputtering, atomic layer deposition (ALD), or the like.

Referring to FIG. 6, the conductive layer 540 and diffusion barrier layer 530 may be processed to form conductive plugs 540a inside the trenches 525. The conductive layer 540 and diffusion barrier layer 530 may be planarized so that surfaces of the conductive layer 540 and diffusion barrier layer 530 and a surface of the middle layer 520 are exposed on the same plane.

The conductive layer 540 and diffusion barrier layer 530 may be processed using the thin layer processing apparatus 1 described with respect to FIGS. 1 and 2, and the method of processing a thin layer described with respect to FIG. 3. In other words, a chemical mechanical polishing process using a polishing slurry may first be performed on the conductive layer 540 and diffusion barrier layer 530 that are stacked on the base substrate 510. In a specific embodiment, the polishing slurry may include a silicon oxide material as an abrasive and hydrogen peroxide ($H_2O_2$) as an oxidizing agent.

The chemical mechanical polishing process may be performed by spraying polishing slurry on the polishing pad 120 of the polishing module 10, bringing the polishing pad 120 accommodating the polishing slurry into contact with the conductive layer 540, and polishing the conductive layer 540 and diffusion barrier layer 530. After the chemical mechanical polishing process is ended, the polishing pad 120 may be cleaned using deionized water.

Subsequently, the base substrate 510 may be cleaned in the polishing module 10 using an in-situ cleaning process. The in-situ cleaning process may use a cleaning slurry. The cleaning slurry may, for example, include a metal oxide material powder as an abrasive and hydrogen peroxide ($H_2O_2$) as an oxidizing agent. The metal oxide material powder may, for example, include silica ($SiO_2$), alumina ($Al_2O_3$), ceria ($CeO_2$), titania ($TiO_2$), or a combination including two or more of these materials. In an embodiment, the cleaning slurry may include the same material as the polishing slurry. In the embodiment that will be described hereinafter, the same material as the polishing slurry is used as the cleaning slurry.

In an embodiment, the in-situ cleaning process may be performed by spraying polishing slurry 410 on the polishing pad 120 and bringing the polishing pad 120 loaded with the polishing slurry into contact with the conductive plug 540a, diffusion barrier layer 530 and middle layer 520. At this time, the flow rate of the polishing slurry provided to the polishing pad 120 in the cleaning process may be substantially the same as the flow rate of the polishing slurry provided to the polishing pad 120 in the chemical mechanical polishing process. However, the spraying pressure of the polishing slurry sprayed on the polishing pad 120 in the cleaning process may be about 1/10 to 1/3 of the spraying pressure of the polishing slurry sprayed on the polishing pad 120 in the chemical mechanical polishing process. In addition, in the cleaning process, the speed to condition the polishing pad 120 may be slower than the speed to condition the polishing pad 120 in the chemical mechanical polishing process.

On the basis of the cleaning condition described above, the by-products of the polishing process remaining on the base substrate 510 can be effectively removed without damaging the conductive plugs 540a. After performing the cleaning process in the polishing module 10, an additional wet cleaning process may be performed in the cleaning module 20 using an ex-situ cleaning process. The wet cleaning process may be performed using a wet cleaning solution, such as ammonium hydroxide ($NH_4OH$) or hydrogen fluoride (HF). In an embodiment, no material that is considered to be an etchant of the conductive plug 540a is applied in the wet cleaning process.

As described above, in an embodiment, the conductive plug 540a comprising a metal material such as tungsten (W) is formed by a chemical mechanical polishing. In addition, a wet cleaning solution that can dissolve the tungsten (W) may not be applied in order to remove the by-products containing tungsten (W) generated during the chemical mechanical polishing process. Instead, the by-products remaining on the base substrate 510 can be removed without damage by sweeping the base substrate 510 using the polishing slurry applied to the chemical mechanical polishing process.

Various embodiments of have been disclosed above for illustrative purposes. Those of ordinary skill in the art will appreciate that various modifications, additions and substitutions are possible, without departing from the scope of the accompanying claims.

What is claimed is:

1. A method of processing a thin layer, comprising:
providing a substrate having a processing target layer into a polishing module of a thin layer processing apparatus;
performing chemical mechanical polishing on the processing target layer using a polishing pad accommodating a polishing slurry in the polishing module; and
cleaning the substrate by having the processing target layer being in contact with the polishing pad using a cleaning slurry including an abrasive in the polishing module,
wherein while the cleaning process is performed, the cleaning slurry is applied to the polishing pad through a slurry dispenser of the polishing module.

2. The method of claim 1, wherein the substrate comprises a base substrate, and a middle layer disposed on the base substrate, the base substrate having a plurality or trenches, and
the processing target layer comprises a conductive layer filling the trenches.

3. The method of claim 1, wherein the conductive layer comprises at least one selected from the group consisting of copper (Cu), aluminum (Al), ruthenium (Ru), titanium nitride (TiN), tungsten nitride (WN), tantalum nitride (TaN), and ruthenium oxide ($RuO_2$).

4. The method of claim 1, wherein the polishing slurry and the cleaning slurry are made of the same material.

5. The method of claim 4, wherein the polishing slurry and the cleaning slurry comprise a metal oxide powder as an abrasive, and hydrogen peroxide ($H_2O_2$) as an oxidizing agent, and
the metal oxide powder comprises at least one of silica ($SiO_2$), alumina ($Al_2O_3$), ceria ($CeO_2$), and titania ($TiO_2$).

6. The method of claim 1, wherein applying the chemical mechanical polishing process comprises:
spraying the polishing slurry on the polishing pad; and
bringing the polishing pad accommodating the polishing slurry into contact with the processing target layer, and
wherein cleaning the substrate comprises:
spraying the cleaning slurry on the polishing pad; and moving the processing target layer across the polishing pad.

7. The method of claim 6, wherein the cleaning slurry is sprayed onto the polishing pad at a pressure of 1/10 to 1/3 of a spray pressure of the polishing slurry.

8. The method of claim 7, wherein a flow rate of the cleaning slurry provided to the polishing pad is substantially the same as a flow rate of the polishing slurry provided to the polishing pad.

9. The method of claim 6, further comprising cleaning the polishing pad with deionized water between the chemical mechanical polishing and the cleaning the substrate.

10. The method of claim 6,
wherein the polishing pad is conditioned during the chemical mechanical polishing and the cleaning the substrate, and
wherein a conditioning speed for cleaning the substrate is slower than a conditioning speed for the chemical mechanical polishing process.

11. The method of claim 1, further comprising:
removing the cleaned substrate from the polishing module;
transferring the cleaned substrate to a cleaning module of the thin layer processing apparatus; and
cleaning the substrate using wet cleaning in the cleaning module.

12. The method of claim 11, wherein the wet cleaning is performed using a cleaning solution that comprises ammonium hydroxide ($NH_4OH$) or hydrogen fluoride (HF).

13. A method of processing a thin layer, comprising:
applying chemical mechanical polishing to a processing target layer on a substrate using a polishing pad accommodating a polishing slurry in a polishing module; and
cleaning the substrate in-situ by having the processing target layer being in contact with the polishing pad using the polishing slurry in the polishing module,
wherein the processing target layer comprises at least one selected from the group consisting of copper (Cu), aluminum (Al), ruthenium (Ru), titanium nitride (TiN), tungsten nitride (WN), tantalum nitride (TaN), and ruthenium oxide ($RuO_2$), and
the polishing slurry comprises a metal oxide powder as an abrasive, and hydrogen peroxide ($H_2O_2$) as an oxidizing agent,
wherein the chemical mechanical polishing process comprises:
spraying the polishing slurry on a polishing pad; and
bringing the polishing pad accommodating the polishing slurry into contact with the processing target layer, and
wherein the in-situ cleaning comprises:
spraying the polishing slurry on the polishing pad; and
moving the processing target layer across the polishing pad,
wherein a flow rate of the polishing slurry provided to the polishing pad in the in-situ cleaning is substantially the same as a flow rate of the polishing slurry provided to the polishing pad in the chemical mechanical polishing, and
a spray pressure of the polishing slurry in the in-situ cleaning is about 1/10 to 1/3 of a spray pressure of the polishing slurry in the chemical mechanical polishing.

14. The method of claim 13, wherein the substrate comprises a base substrate and a middle layer with a plurality of trenches, and
the processing target layer comprises a conductive layer filling the trench hole patterns.

15. The method of claim 13, wherein each of the chemical mechanical polishing and the in-situ cleaning further comprises conditioning the polishing pad, and
wherein a conditioning speed in the in-situ cleaning is slower than a conditioning speed in the chemical mechanical polishing.

16. The method of claim 13, further comprising cleaning the cleaned substrate using an ex-situ wet cleaning.

17. The method of claim 16, wherein the ex-situ wet cleaning uses a cleaning solution comprising ammonium hydroxide ($NH_4OH$) or hydrogen fluoride (HF).

18. The method of claim 13, further comprising cleaning the polishing pad with deionized water between the chemical mechanical polishing process and the in-situ cleaning.

* * * * *